United States Patent
Detry

(10) Patent No.: US 7,563,720 B2
(45) Date of Patent: Jul. 21, 2009

(54) BORON DOPED SHELL FOR MEMS DEVICE

(75) Inventor: James F. Detry, Plymouth, MN (US)

(73) Assignee: Honeywell International Inc., Morristown, NJ (US)

( * ) Notice: Subject to any disclaimer, the term of this patent is extended or adjusted under 35 U.S.C. 154(b) by 6 days.

(21) Appl. No.: 11/781,470

(22) Filed: Jul. 23, 2007

(65) Prior Publication Data
US 2009/0026559 A1    Jan. 29, 2009

(51) Int. Cl.
*H01L 21/311* (2006.01)
(52) U.S. Cl. .................. 438/700; 438/311; 438/510; 438/712; 257/E21.32; 257/E21.218; 257/E21.548; 257/E21.549
(58) Field of Classification Search ............ 438/51, 438/106, 311, 510, 700, 712
See application file for complete search history.

(56) References Cited

U.S. PATENT DOCUMENTS

| | | | |
|---|---|---|---|
| 5,451,809 A * | 9/1995 | Shiozawa et al. ........... 257/516 |
| 5,977,579 A * | 11/1999 | Noble ........................ 257/302 |
| 6,143,583 A | 11/2000 | Hays | |
| 6,210,988 B1 | 4/2001 | Howe | |
| 6,277,666 B1 | 8/2001 | Hays | |
| 6,521,041 B2 | 2/2003 | Wu | |
| 6,730,615 B2 | 5/2004 | Goldstein | |
| 6,770,504 B2 * | 8/2004 | Horning et al. ............... 438/48 |
| 7,365,385 B2 * | 4/2008 | Abbott ...................... 257/302 |
| 2007/0041076 A1 | 2/2007 | Zhong | |
| 2007/0105339 A1 | 5/2007 | Faris | |
| 2007/0164379 A1 | 7/2007 | Brown | |

* cited by examiner

*Primary Examiner*—David Nhu
(74) *Attorney, Agent, or Firm*—Fogg & Powers LLC

(57) ABSTRACT

A wafer for use in a MEMS device having two doped layers surrounding an undoped layer of silicon is described. By providing two doped layers around an undoped core, the stress in the lattice structure of the silicon is reduced as compared to a solidly doped layer. Thus, problems associated with warping and bowing are reduced. The wafer may have a pattered oxide layer to pattern the deep reactive ion etch. A first deep reactive ion etch creates trenches in the layers. The walls of the trenches are doped with boron atoms. A second deep reactive ion etch removes the bottom walls of the trenches. The wafer is separated from the silicon substrate and bonded to at least one glass wafer.

14 Claims, 21 Drawing Sheets

BORON DOPED SHELL FOR MEMS DEVICE

FIELD

The present invention relates to a wafer and a method of manufacturing a wafer for use as a micro-electromechanical sensor ("MEMS") device, and, more specifically, a wafer and a method of manufacturing a wafer for a MEMS device that requires a large epitaxial layer thickness, such by using an epitaxial layer with an undoped core and a highly doped layer on both sides of the undoped layer.

BACKGROUND

Many existing methods of manufacturing MEMS devices use a layer of silicon heavily doped with boron atoms. Because the heavily doped silicon dissolves much more slowly during the etching process than undoped silicon, the heavily doped silicon yields greater control of the effect of the etching process.

During the doping process, boron atoms are added to the crystal lattice of the silicon layer. When the boron atoms are added to the silicon crystal lattice structure, the smaller boron atoms replace larger silicon atoms in the structure. This causes structural stress in the crystal lattice structure. The amount of structural stress increases with the thickness of the layer of heavily doped silicon. MEMS devices typically require a thick epitaxial layer, in some cases greater than 20 μm.

Sometimes, when manufacturing wafers with a large epitaxial layer thickness, certain problems are caused by the high structural stress of the heavily doped silicon layer. For instance, the structural stress created in the heavily boron doped silicon layer by the smaller size of the boron atoms may cause the wafer to bow or warp as the crystal lattice structure of the doped silicon layer attempts to align with the lattice structure of the undoped wafer. This may cause the wafer to become disfigured and unsuitable for use. Because the structural stress of the heavily doped silicon layer increases with the thickness of the heavily doped silicon layer, there is an upper limit on the thickness of the epitaxial layer that may be used to fabricate these wafers; namely, the thickness at which the amount of warping caused by the structural stress is small enough that the wafers remain within the manufacturing tolerance requirements of the MEMS sensors.

However, certain types of MEMS devices, such as gyroscopic sensors, require an epitaxial thickness greater than the epitaxial layer thicknesses that are able to be produced by traditional methods without experiencing the warping problem discussed above. Current methods of minimizing the warping of the wafers in order to be able to manufacture an acceptable semiconductor circuit that requires a thick epitaxial layer are expensive and time-consuming.

One such method for manufacturing wafers with a large epitaxial layer thickness is to deposit a second epitaxial layer on the backside of a wafer to balance the stress. However, the process of adding the backside epitaxial layer involves added cost and materials, and requires additional time to manufacture. Further, even using this method there remains an upper limit to the thickness of the epitaxial layer that may be produced.

Another method for manufacturing wafers with a large epitaxial layer thickness is to deposit germanium atoms in the doped epitaxial layer. Because the germanium atoms are larger in size than the silicon atoms, the larger size of the germanium atoms reduces the stress in the epitaxial layer caused by the smaller boron atoms. However, this process requires additional time to produce the wafers, the addition of another element, germanium, and yet the problems of bowing and warping of the wafers remain difficult to control. Further, even using this method there remains an upper limit to the thickness of the epitaxial layer that may be produced.

Thus, the cost of wafers manufactured by adding a backside epitaxial layer is significantly higher than those wafers that do not require a large epitaxial thickness and do not require depositing a backside epitaxial layer.

An additional problem encountered when manufacturing MEMS devices with heavily doped epitaxial layer is curl. Any nonuniformities in the epitaxial layer may cause the wafer to curl when released from the silicon substrate on which the wafer is built. These nonuniformities are not well-understood or easily controlled. Excessive curl in the epitaxial layer may cause the wafer to be unsuitable for use, as distortions in the physical shape of the MEMS device cause the quality of the sensor to degrade. This adds additional cost to the manufacturing process in that the defective wafers must be identified and removed from the batch of wafers that meet manufacturing specifications.

Therefore, there is a need for an improved method of manufacturing MEMS devices that require a thick epitaxial layer.

SUMMARY

The present invention relates to a wafer and a method for manufacturing a wafer for use in MEMS devices. On this wafer are deposited a first layer of heavily doped silicon, a layer of undoped silicon, and a second layer of heavily doped silicon. This configuration results in less stress on the wafer because the thicknesses of the doped silicon layers are smaller than those used in existing methods of manufacturing MEMS devices. Thus, the epitaxial layer exerts less stress on the wafer in its attempts to align its crystal lattice structure with the crystal lattice structure of the wafer. Lower lattice stress in the wafer may decrease problems associated with manufacturing MEMS devices, such as bowing of the wafer. Also, the present method of producing the wafer of the present invention is less costly than currently known methods, as the silicon layers need only be formed on one side of the wafer.

The use of a photoresist layer to pattern an oxide layer creates a mask that allows the wafer to be etched twice by deep reactive ion etching. The photoresist is optically patterned by exposure to ultraviolet light, and the oxide layer is etched where the photoresist layer has been removed by the optical patterning. The remaining photoresist is removed by wet strip, plasma ashing, or other conventional methods. The wafer is exposed to a deep reactive ion etch that creates trenches in the silicon layers of the wafer. The trenches are doped to create a layer of heavily doped silicon on the sidewalls and bottom of the trenches. The doped layers on the bottoms of the trenches are removed by a second deep reactive ion etch, using the same pattern created by the oxide layer for the first deep reactive ion etch. The oxide layer is then removed, the wafer is bonded to a glass wafer, and the undoped silicon substrate is removed. In another example, a glass wafer is bonded to the top and bottom surfaces of the wafer.

The present invention is a cost-effective way of producing wafers that can tolerate large epitaxial layers without excessive bowing or warping due to lattice stress caused by heavy boron doping.

These as well as other aspects and advantages will become apparent to those of ordinary skill in the art by reading the following detailed description, with reference where appropriate to the accompanying drawings. Further, it is understood that this summary is merely an example and is not intended to limit the scope of the invention as claimed.

BRIEF DESCRIPTION OF THE DRAWINGS

Presently preferred embodiments are described below in conjunction with the appended drawing figures, wherein like reference numerals refer to like elements in the various figures, and wherein.

DETAILED DESCRIPTION

A wafer for use in a micro-electromechanical sensor ("MEMS") device and method of manufacturing a wafer for use in a MEMS device is herein described. FIGS. 1*a*-1*h* show a method of manufacturing and patterning a wafer having two highly doped layers surrounding an undoped core silicon layer. FIGS. 2-7 and 8-14 show two example methods of processing the wafer to produce a wafer for use in a MEMS device, which requires a large epitaxial layer thickness.

Figure 1A:
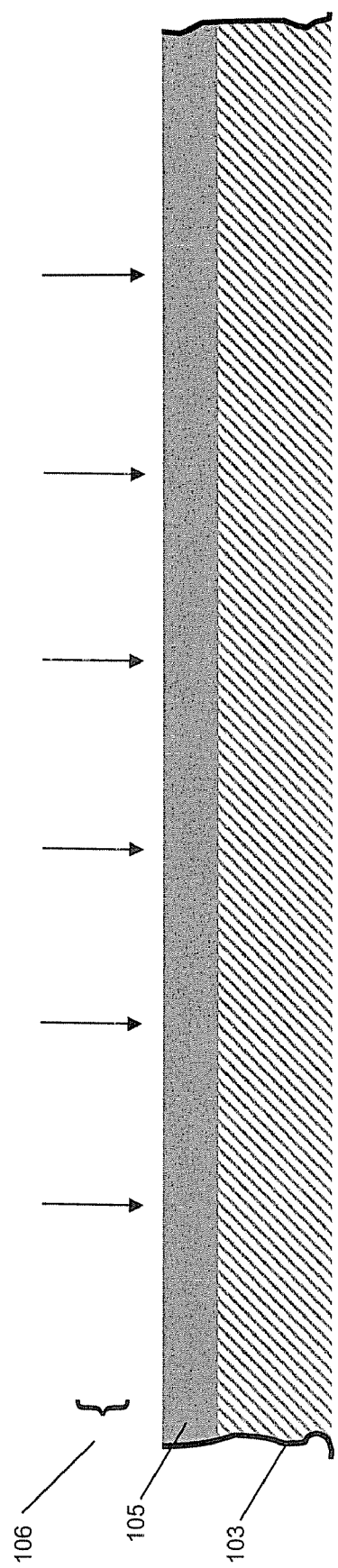
FIG. 1*a* is a side view of a silicon substrate and a bottom doped silicon layer, according to an example.

FIG. 1*a* shows a silicon substrate 103 and a bottom doped silicon layer 105. The bottom silicon layer 105 is located on the silicon substrate 103 and may be deposited by applying a gas 106 containing silicon and boron atoms to the silicon substrate 103. The silicon and boron atoms are deposited onto the silicon substrate 103 and form the bottom doped silicon layer 105. The relative concentrations of boron and silicon atoms may be modified to obtain the desired doping threshold, which may be determined by the customer or manufacturer of the wafer. Typical concentrations of boron atoms in the bottom doped silicon layer 105 are between about $5\times10^{19}$ cm$^{-3}$ and $5\times10^{20}$ cm$^{-3}$. The bottom doped silicon layer 105 may be any thickness, and may preferably be less than 1 µm.

Figure 1B:
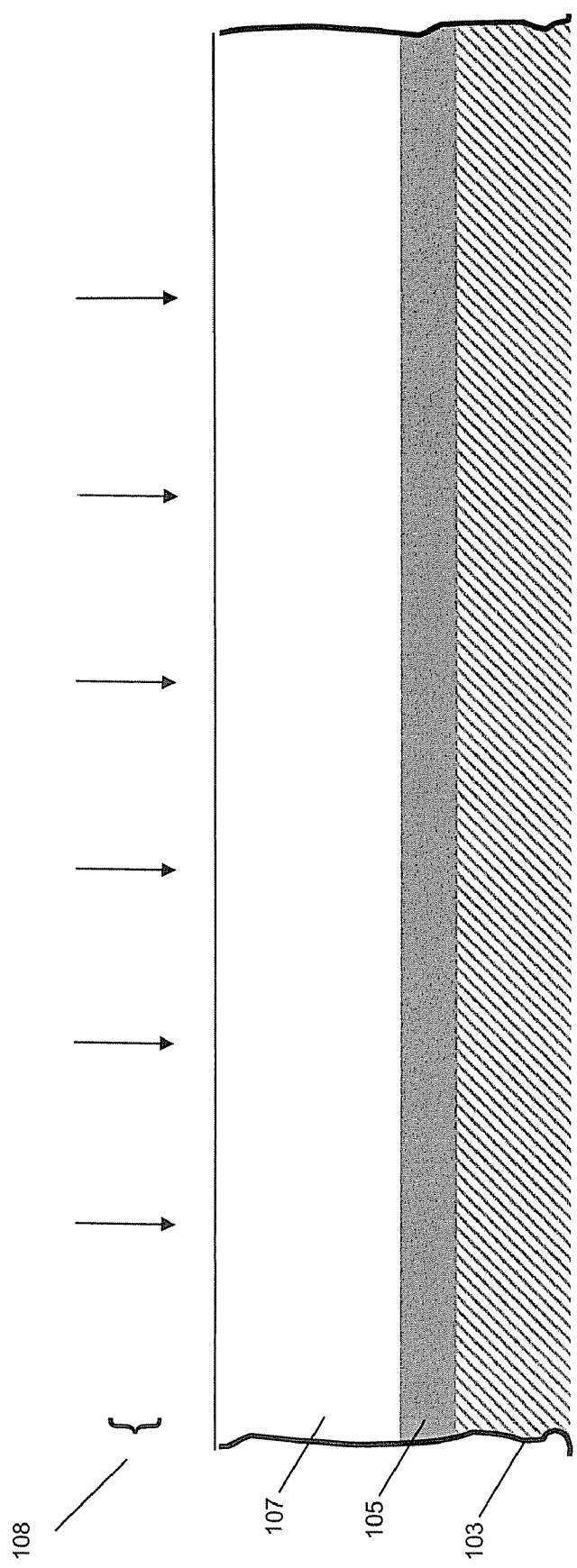
FIG. 1*b* is a side view of the silicon substrate, the bottom doped silicon layer, and an undoped silicon core layer, according to an example.

FIG. 1*b* shows the silicon substrate 103, with the bottom doped silicon layer 105 and an undoped silicon core layer 107. The undoped silicon core layer 107 is deposited by applying a gas 108 containing silicon atoms. The undoped silicon core layer 107 may be deposited in the thickness necessary to achieve the desired thickness of the epitaxial layer 113, shown in FIG. 1*c*.

Figure 1C:
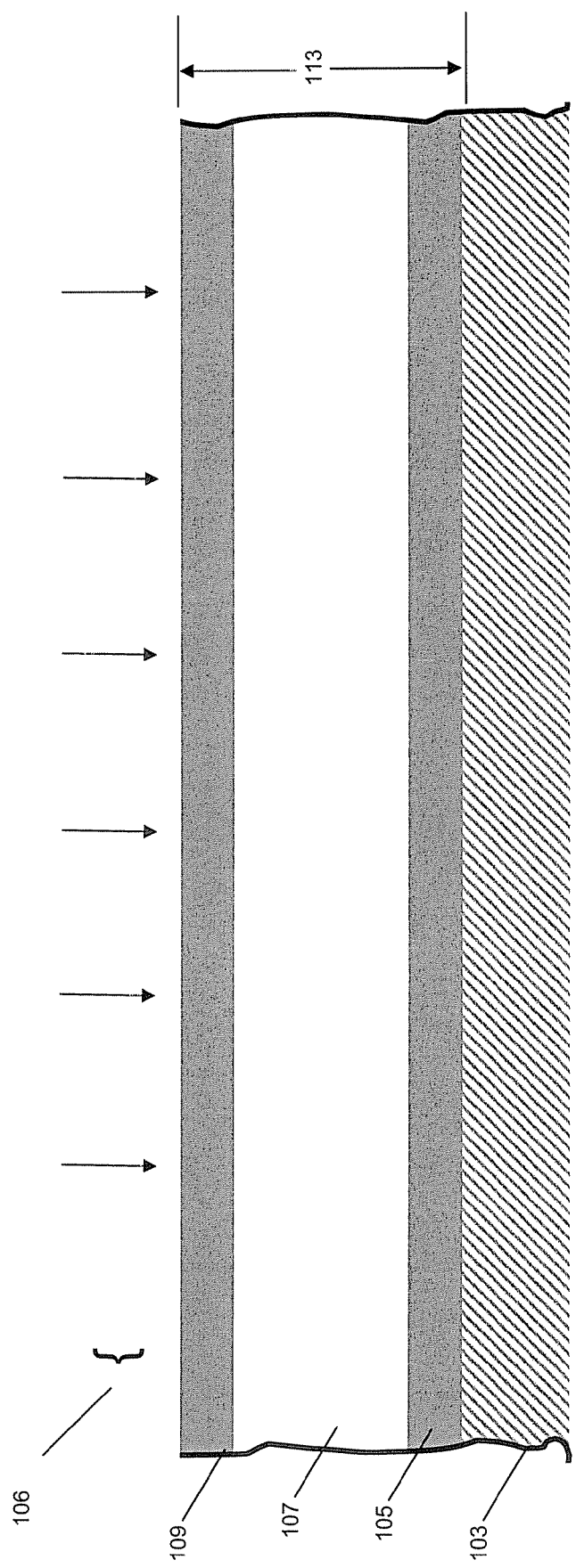
FIG. 1*c* is a side view of an unetched wafer composed of the silicon substrate, the bottom doped silicon layer, the undoped silicon core layer, and a top doped silicon layer, according to an example.

FIG. 1*c* shows the silicon substrate 103, the bottom doped silicon layer 105, the undoped silicon core layer 107, and a top doped silicon layer 109. The top doped silicon layer 109 may be deposited by applying the gas 106 containing silicon and boron atoms to the undoped silicon core layer 107, as described with respect to FIG. 1*a*. The top doped silicon layer 109 may be any thickness, and may preferably be less than 1 µm.

During the time that layers of the wafer are being deposited, boron atoms may diffuse into the silicon layers 103, 107 adjacent to the top and bottom doped silicon layers 109, 105. Both the doping concentration and the thicknesses of the top and bottom doped silicon layers 109, 105 may also be adjusted to compensate for this "doping leak" problem.

Figure 1D:
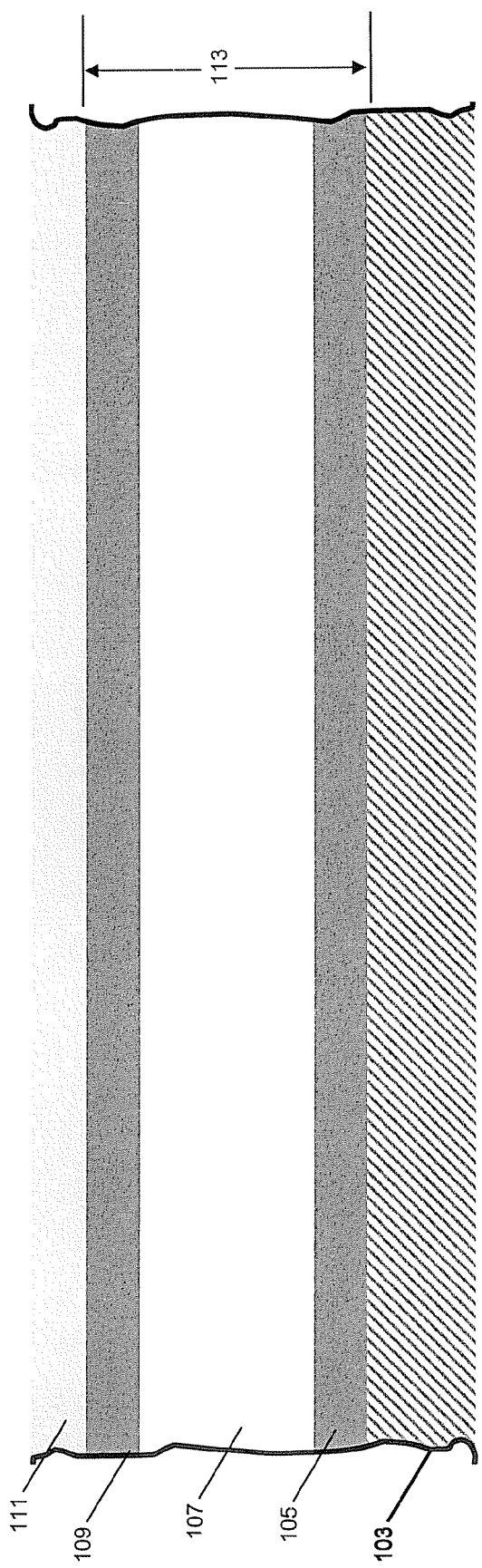
FIG. 1*d* is a side view of the unetched wafer with an oxide layer, according to an example.

FIG. 1*d* shows the unetched wafer, composed of the silicon substrate 103, the bottom doped silicon layer 105, the undoped silicon core layer 107, the top doped silicon layer 109, and an oxide layer 111. The bottom doped silicon layer 105, the undoped silicon core layer 107, and the top doped silicon layer 109 form the epitaxial layer 113.

The oxide layer 111 may be a composition of silicon dioxide. The oxide layer 111 acts as the mask for the deep reactive ion etching, discussed further with respect to FIG. 2. The oxide layer 111 may be deposited by conventional methods.

Figure 1E:
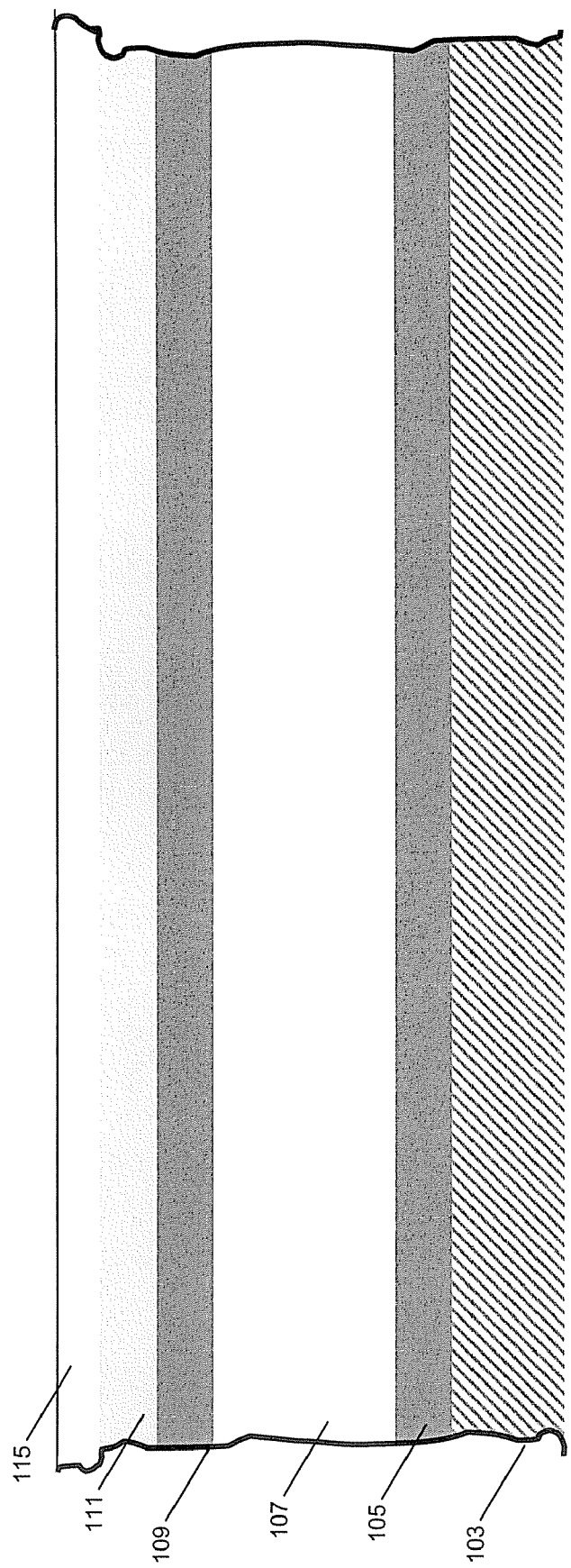
FIG. 1*e* is a side view of the unetched wafer with the oxide layer and a layer of photoresist, according to an example.

As shown in FIG. 1*e*, a layer of photoresist 115 is deposited onto the oxide layer 111. The photoresist 115 may be either positive or negative photoresist, and may be any type of photoresist known in the art.

Figure 1F:
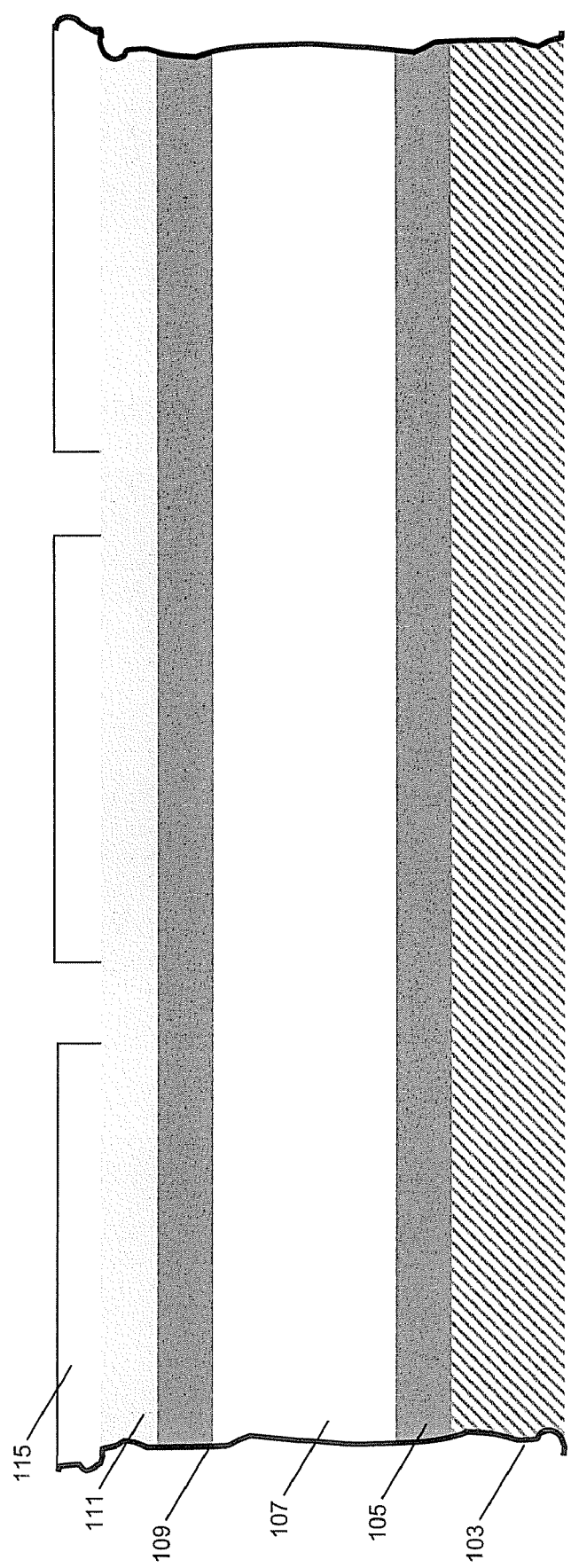
FIG. 1*f* is a side view of the unetched wafer with the oxide layer and a layer of patterned photoresist, according to an example.
Figure 2:
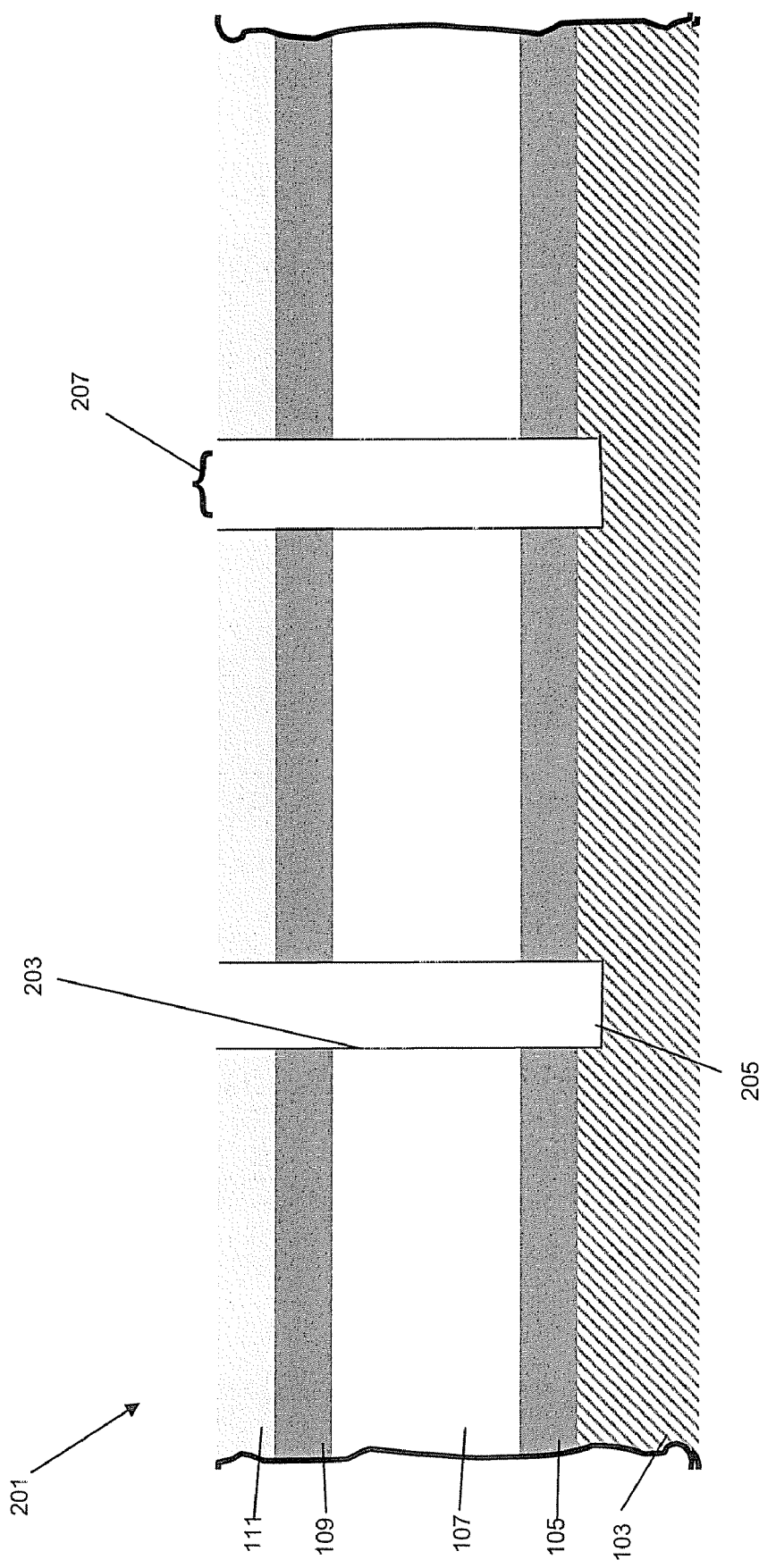
FIG. 2 is a side view of the wafer after deep reactive ion etching, according to an example.

As shown in FIG. 1*f*, the photoresist 115 is patterned by applying ultraviolet light to the photoresist 115 to obtain the desired pattern for deep reactive ion etching, discussed further with respect to FIG. 2.

Figure 1G:
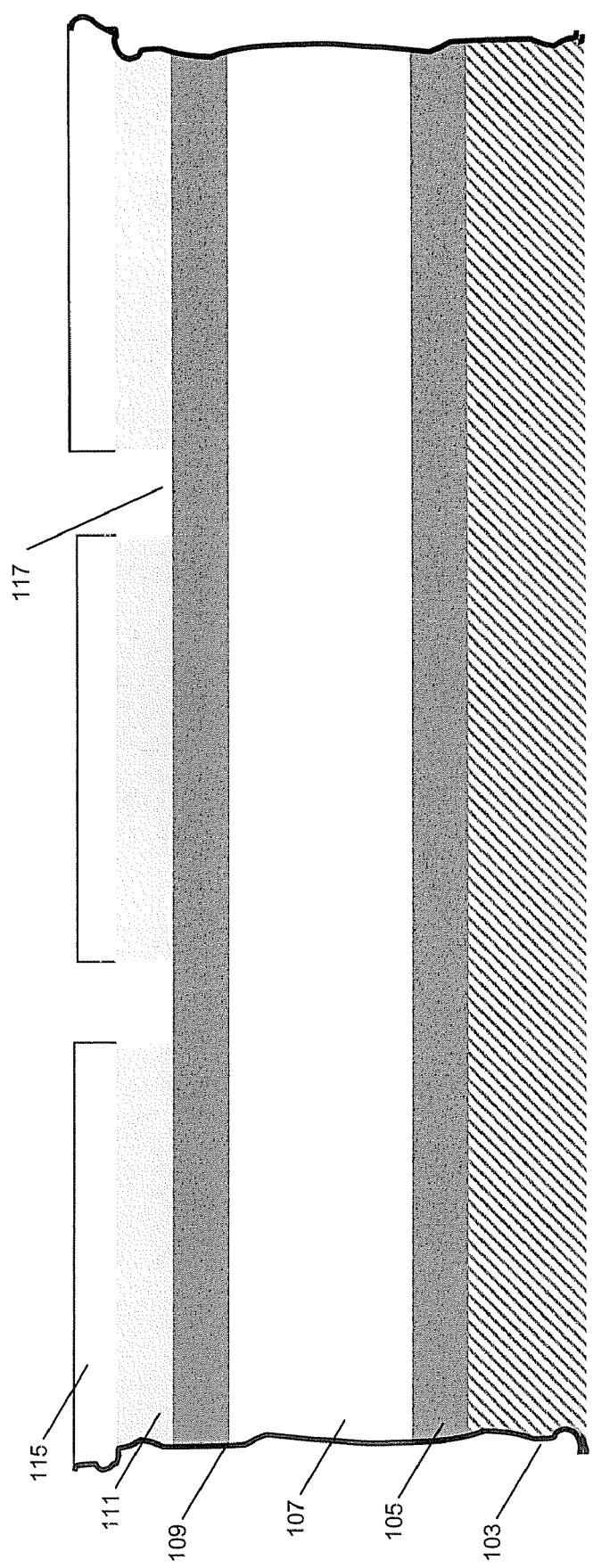
FIG. 1*g* is a side view of the unetched wafer with the etched oxide layer, according to an example.

FIG. 1*g* shows the unetched wafer with a patterned photoresist layer 115 and a patterned oxide layer 111. The oxide layer 111 is patterned by etching the oxide layer with a plasma etch, a buffered oxide etch, which may be a solution of hydrofluoric acid. The etch removes the oxide layer 111 in the areas in which no photoresist 115 remains. In this way, the oxide layer 111 is now patterned into the oxide pattern 117, which acts as the pattern for the deep reactive ion etch of the silicon layers 105, 107, 109, discussed further with respect to FIG. 2.

Figure 1H:
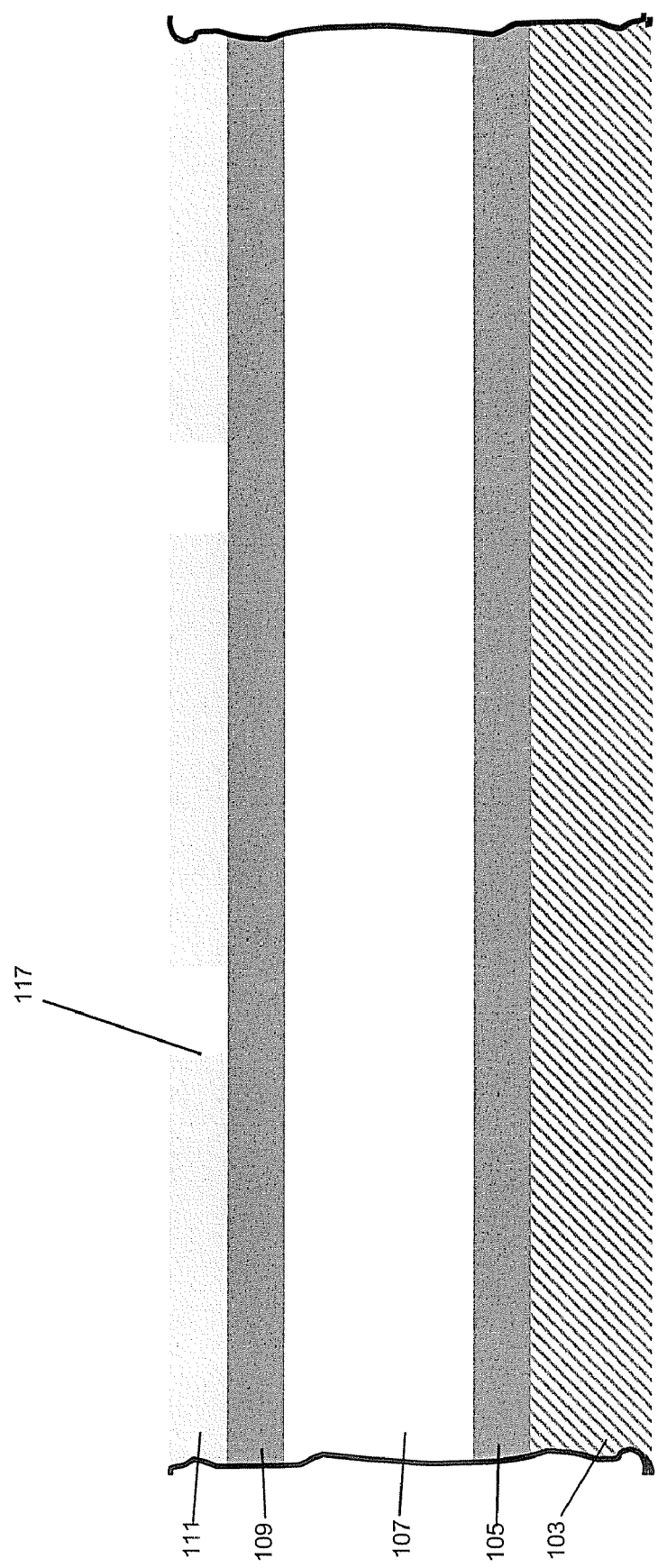
FIG. 1*h* is a side view of the unetched wafer with the etched oxide layer and the photoresist layer removed, according to an example.

FIG. 1h shows the unetched wafer. The remaining photoresist 115 may be removed by conventional methods such as wet strip or plasma ashing, leaving the etched oxide layer 111 in the form of the oxide pattern 117. The unetched wafer in this state may be etched into the desired pattern by deep reactive ion etching to pattern the silicon layers 105, 107, 109 of the unetched wafer, discussed further with respect to FIG. 2.

FIG. 2 shows a wafer 201 after deep reactive ion etching. Other etching methods may also be used. The oxide pattern 117 protects the areas of the wafer 201 upon which it remains and exposes to the deep reactive ion etching only the areas of the wafer 201 that are intended to be etched. The deep reactive ion etching creates trenches 207 in the wafer 201. The depth of the trenches 207 depends on the length of time the wafer 201 is exposed to the deep reactive ion etching process.

This embodiment shows the trenches 207 as extending below the bottom doped silicon layer 105 and into the silicon substrate 103. However, the depth of the trenches 207 may be reduced from the depth shown in FIG. 2 to extend only to the bottom doped silicon layer 105 without piercing through the bottom doped silicon layer 105, as discussed further with respect to FIG. 6. The trenches 207 have trench side walls 203 and trench bottom walls 205. It should be noted that the trench bottom walls 205 may be flat or rounded.

Figure 3:
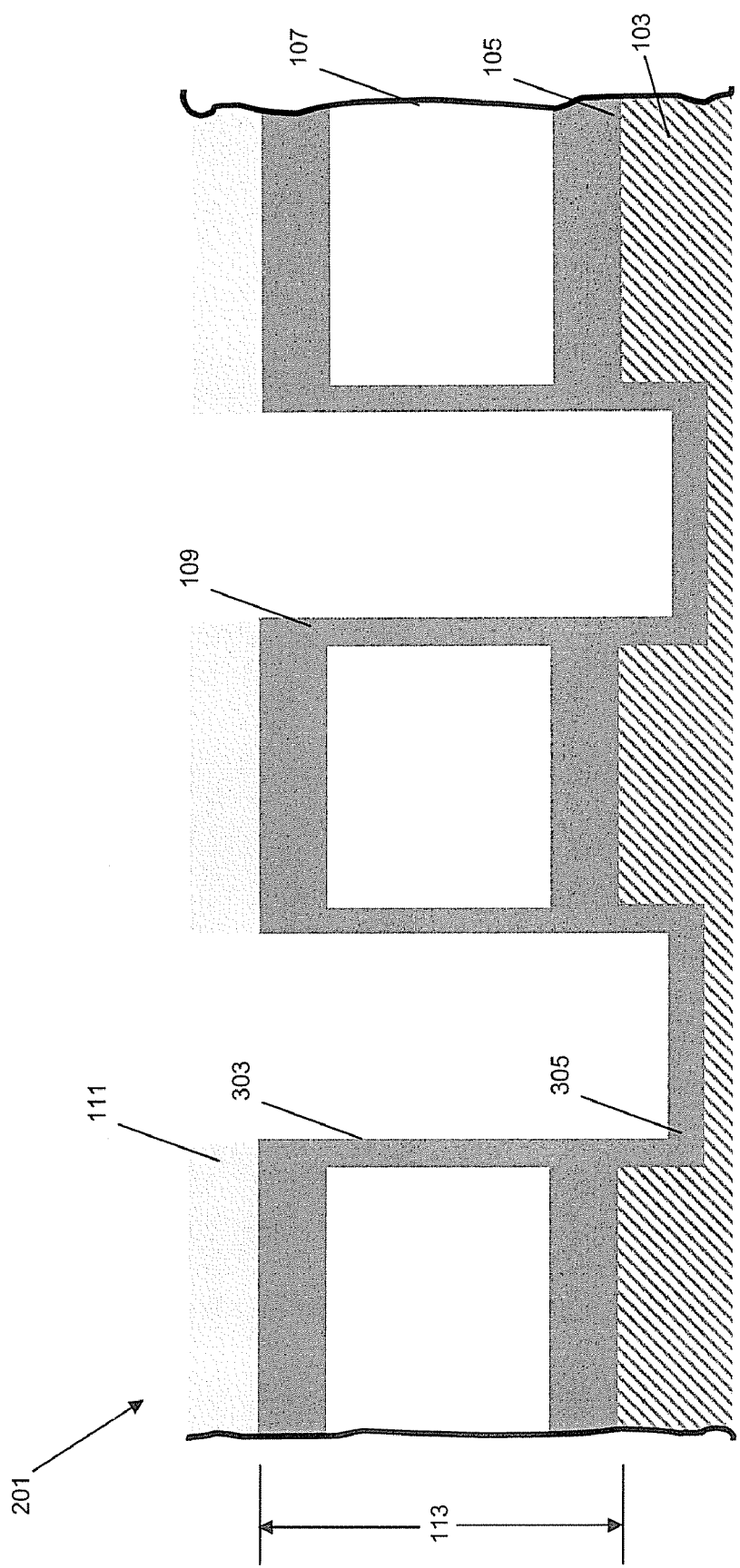
FIG. 3 is a side view of the wafer after doping of the etched surfaces, according to an example.

FIG. 3 shows the wafer 201 after doping of etched surfaces. The trench side walls 203 and the trench bottom walls 205 may be doped by applying boron atoms to the trench side walls 203 and the trench bottom walls 205 and applying heat to the trench side walls 203 and the trench bottom walls 205. The trench side walls 203 and the trench bottom walls 205 are doped to achieve the desired doping threshold and thickness of the doped layers, which may be determined by the customer or manufacturer of the wafer. During the time that heat is applied to the trench side walls 203 and the trench bottom walls 205, boron atoms are diffused into the crystal lattice structure of the silicon. In one embodiment, the trench side walls 203 and the trench bottom walls 205 may be doped at temperatures between 1000° C. and 1200° C. Typical concentrations of boron atoms in doped silicon layers are between about $5 \times 10^{19}$ cm$^{-3}$ and $5 \times 10^{20}$ cm$^{-3}$. After the doping process, the trench side walls 203 and trench bottom walls 205 may have a doped layer comprising the doped trench side walls 303 and the doped trench bottom walls 305.

Figure 4:
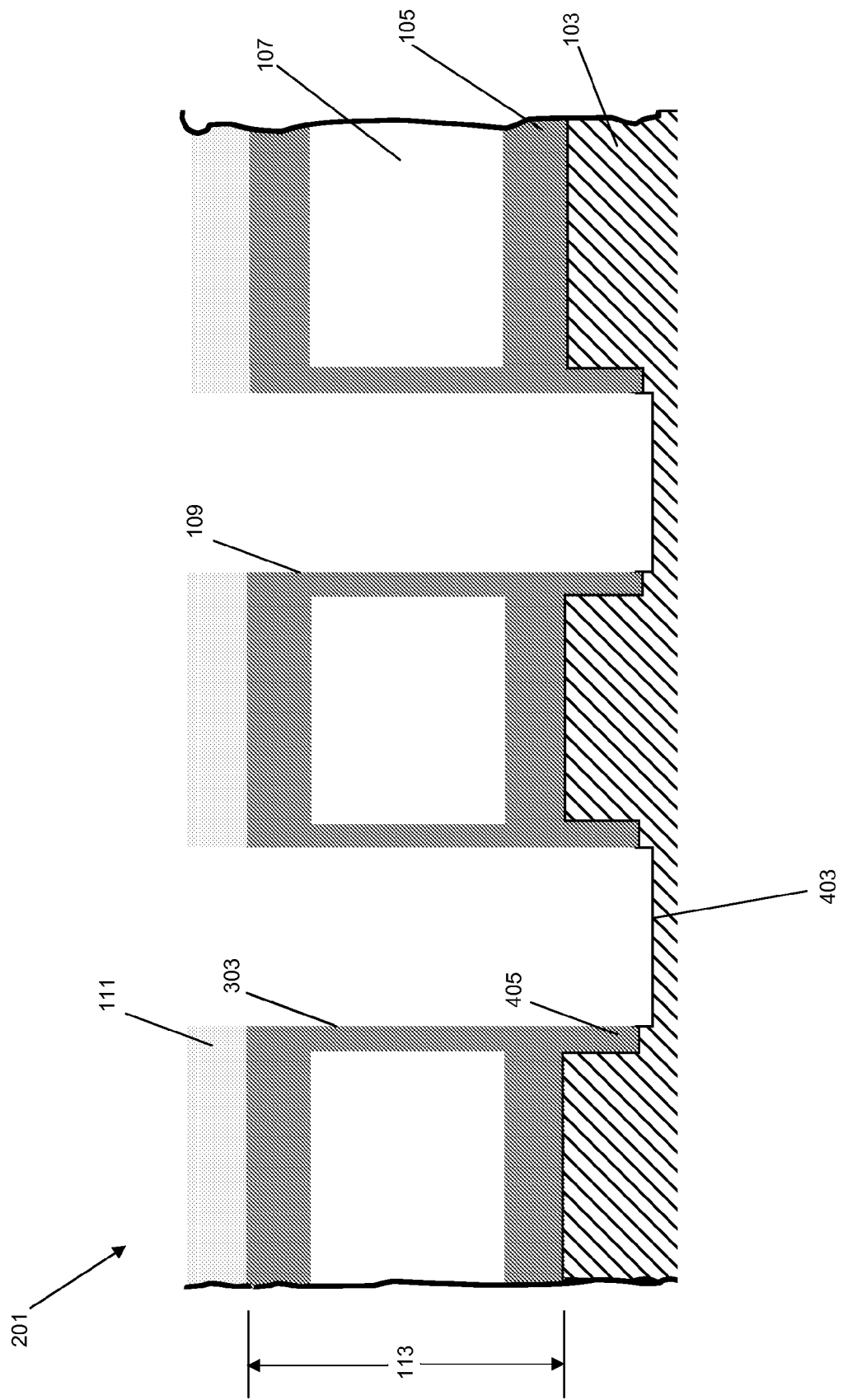
FIG. 4 is a side view of the wafer with the trench bottom wall etched away, according to an example.

FIG. 4 shows the wafer 201 with the doped trench bottom walls 305 etched away to form the trench bottom wall etch 403. Because the oxide layer 111 remains after the doping of the trench side walls 203 and the trench bottom walls 205, the wafer 201 may again be patterned according to the original oxide pattern 117. The presence of the oxide layer 111 allows the trench bottom walls 205 to be re-etched by a deep reactive ion etching process to remove the doped trench bottom walls 305.

The doped trench bottom walls 305 are removed through the deep reactive ion etching process and the silicon substrate 103 is exposed. Because, as discussed with respect to FIG. 2, the trenches 207 are etched to extend below the bottom doped silicon layer 105, the process of doping the trench side walls 203 creates a doped trench side wall 303 that may extend into the silicon substrate 103. When the doped trench bottom walls 305 are etched away, the doped trench side walls 303 may extend past the remaining bottom doped silicon layer 105. These extensions past the bottom doped silicon layer 105 create doped stubs 405.

Figure 5:
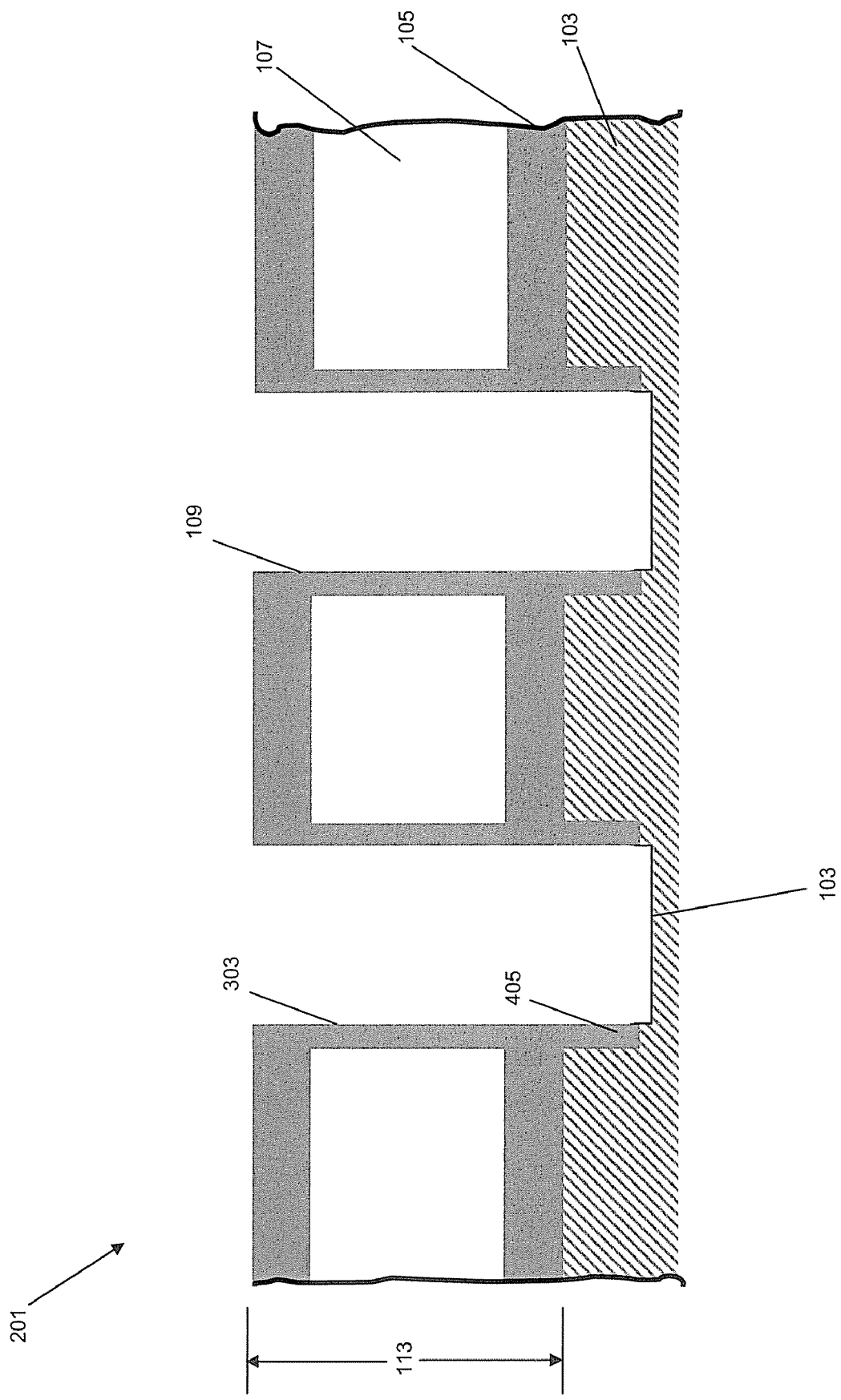
FIG. 5 is a side view of the wafer with the trench bottom wall etched away and the oxide layer removed, according to an example.

As shown in FIG. 5, the remaining portions of the oxide layer 111 are removed by etching away the oxide pattern 117 with a buffered oxide etch.

Figure 6:
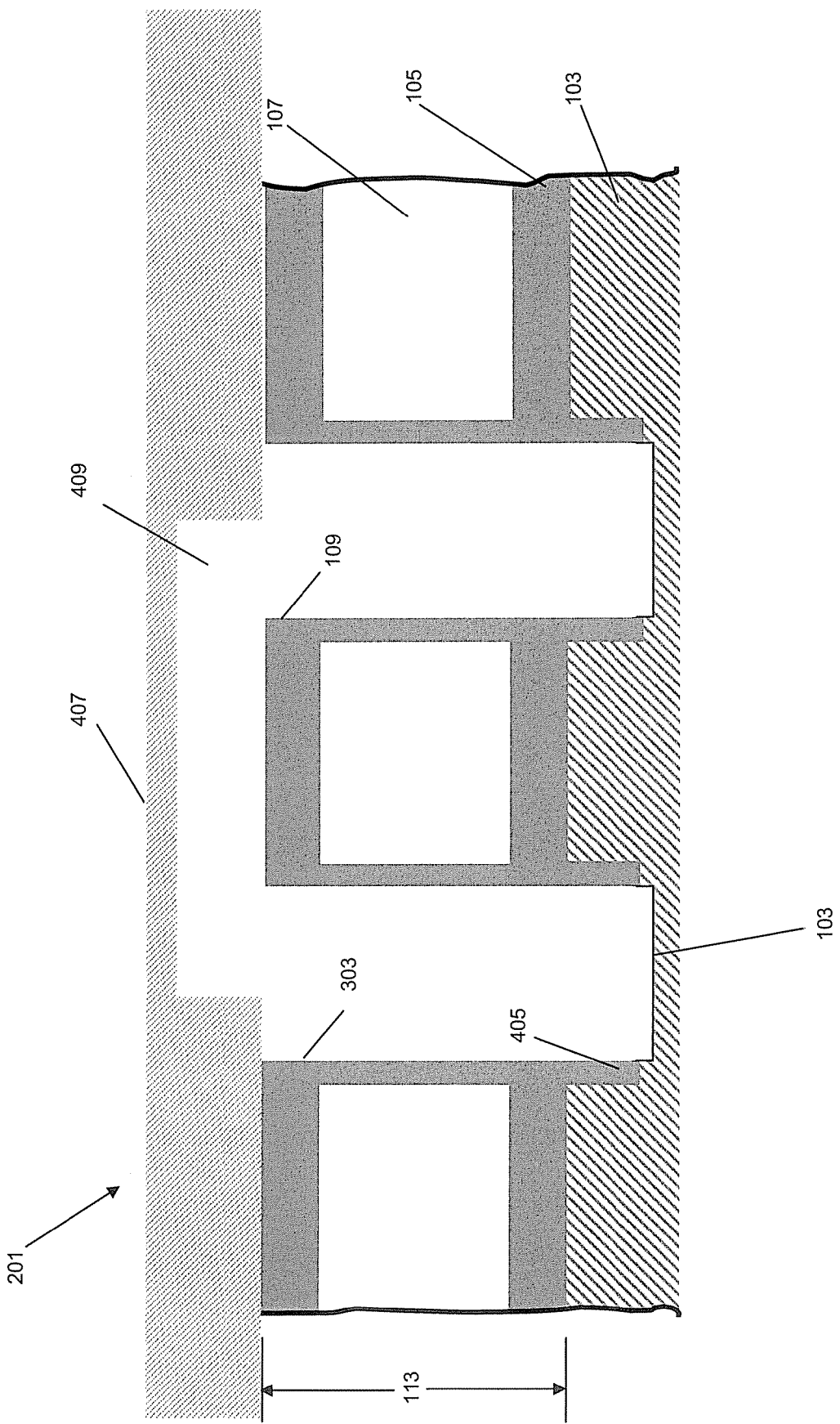
FIG. 6 is a side view of the wafer with the trench bottom wall etched away, the oxide layer removed, and bonded to a glass wafer, according to an example.

As shown in FIG. 6, a glass wafer 407 is bonded to the wafer 201. The glass wafer 407 may be bonded to the top doped silicon layer 105 by anodic bonding. In anodic bonding, a compressive force is applied to the glass wafer 407 to hold it against the top doped silicon layer 109, and heat and a voltage are applied to the glass wafer 407. This creates an electrostatic bonding that holds the glass wafer 407 to the top silicon layer 109. The glass wafer 407 may also be bonded by other conventional means.

The glass wafer 407 has a recess 409 in the cross section of the glass wafer 407. This recess 409 allows the glass wafer 407 to be bonded to a portion of the top doped silicon layer 109 and to still allow portions of the wafer 201 to not be attached to the glass wafer 407. In this way, the portions of the wafer 201 not fixed to the glass wafer 407 may move in response to movement of the MEMS device. The movement of the unfixed portions of the wafer 201 may be sensed to obtain information about the movement or acceleration of the MEMS device.

Figure 7:
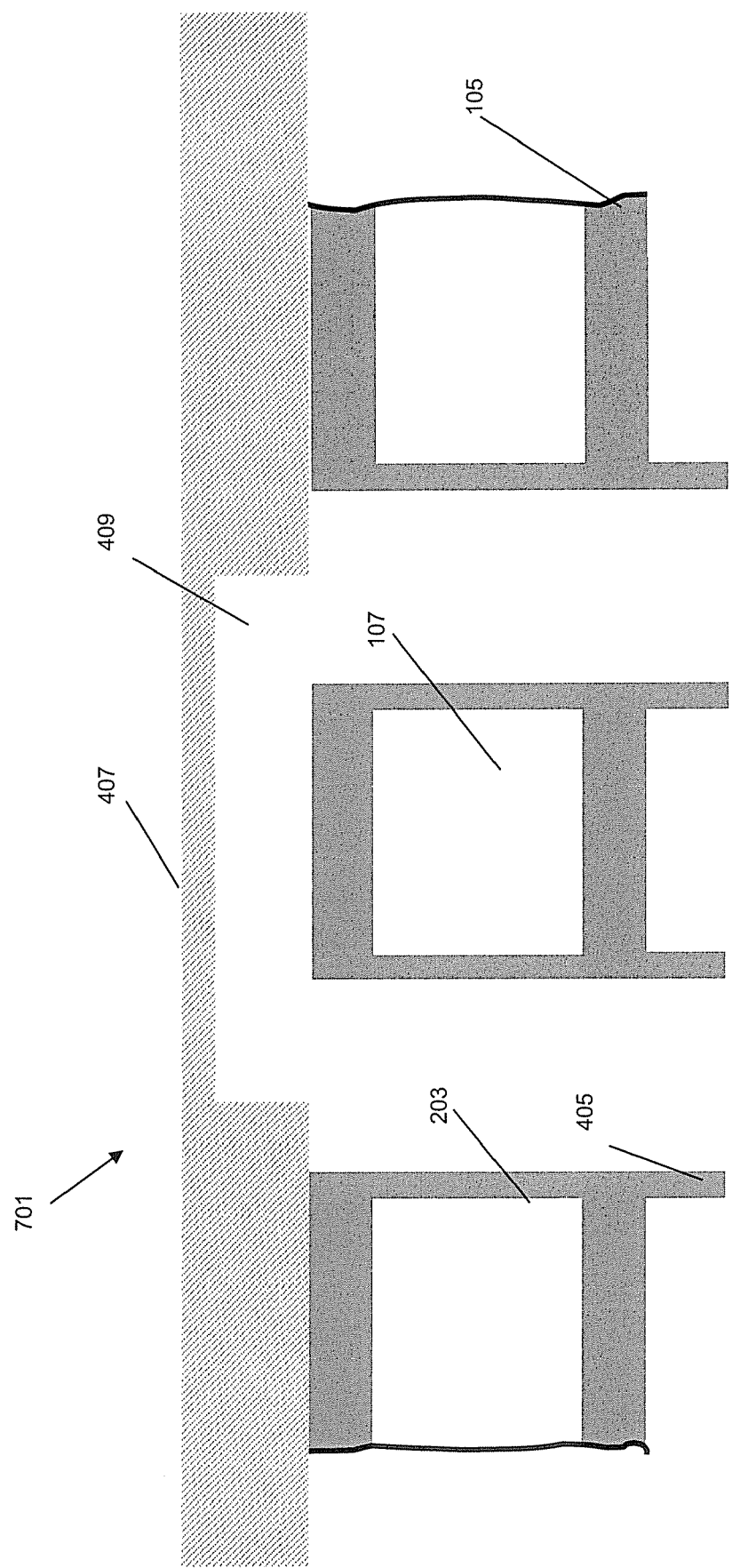
FIG. 7 is a side view of the wafer after removal of the silicon substrate, according to an example.

As shown in FIG. 7, the silicon substrate 103 is removed. The silicon substrate 103 may be removed from the bottom doped silicon layer 105 by an ethylene diamine pyrocatechol treatment ("EDP treatment"). This forms the wafer 701. The wafer 701 may be incorporated into a device for use as a MEMS device or an accelerometer, or any other device which requires a large epitaxial layer thickness.

Figure 8:
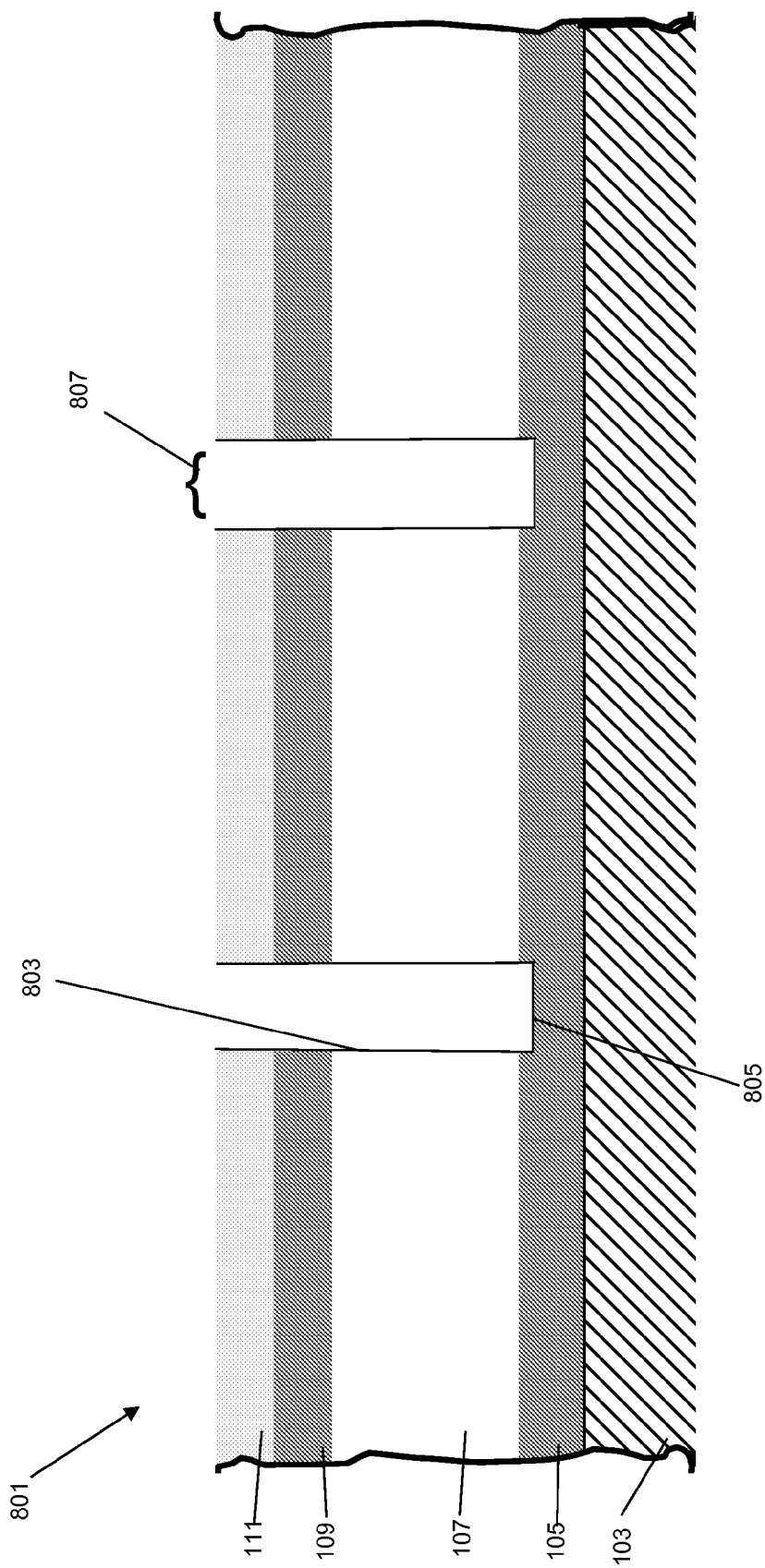
FIG. 8 is a side view of the wafer after deep reactive ion etching, according to an example.

Alternatively, the wafer 201 may be treated so that the etched trenches do not extend past the bottom doped silicon layer 105. In this example, the wafer is constructed as previously discussed with respect to FIGS. 1a-1h. Then, as shown in FIG. 8, the wafer of FIG. 1h is exposed to a deep reactive ion etching, which may etch away the surfaces to which the deep reactive ion etching is exposed. In this way, the oxide pattern 117 exposes only the areas of the wafer 201 that are intended to be etched to the deep reactive ion etching.

The deep reactive ion etching creates trenches 807 in the wafer 801. The trenches 807 have trench side walls 803 and trench bottom walls 805. This embodiment shows the trenches 807 as terminating inside the bottom doped silicon layer 105.

Figure 9:
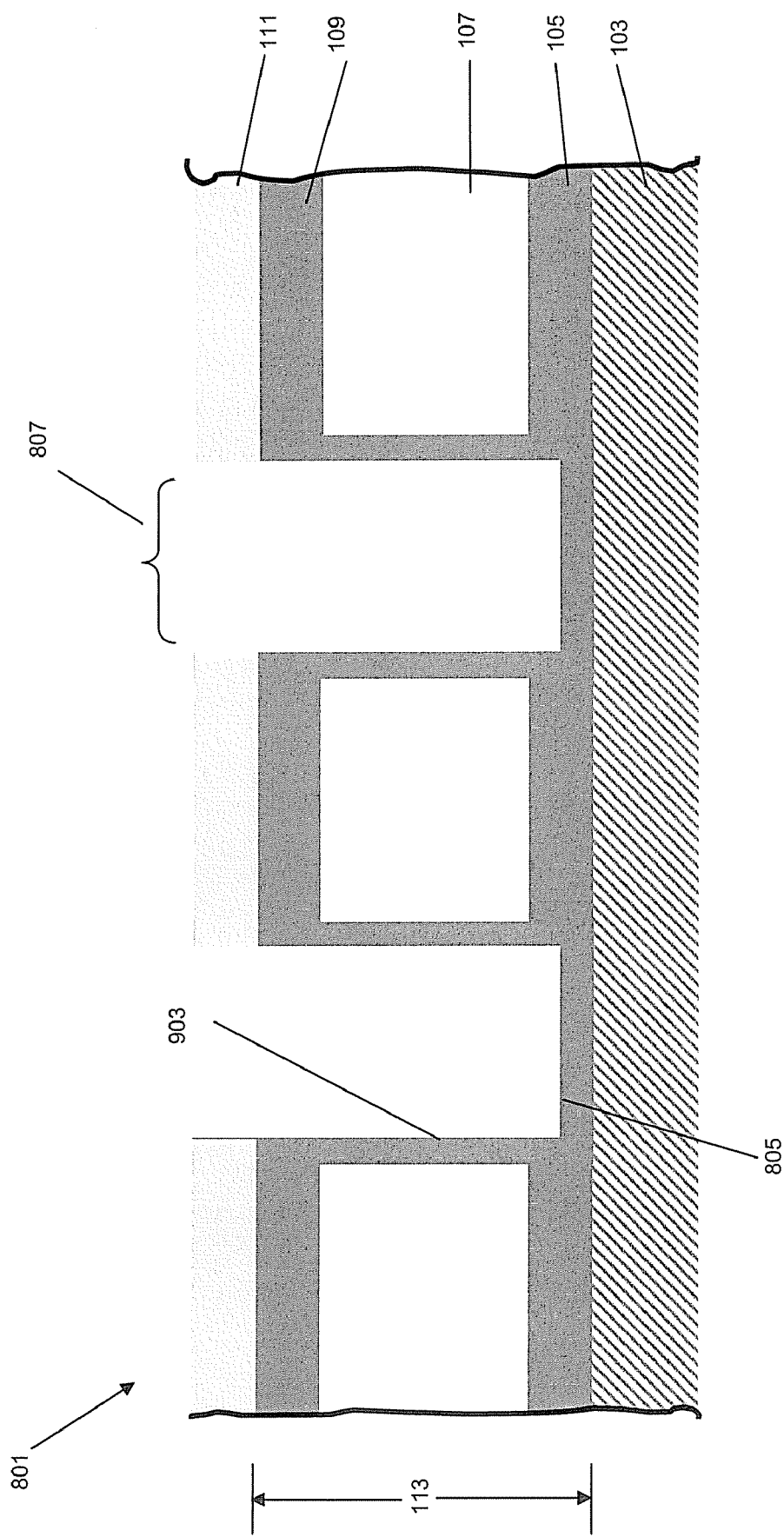
FIG. 9 is a side view of the wafer after doping of the etched surfaces, according to an example.

FIG. 9 shows the wafer 801 after the trench side walls 803 and trench bottom walls 805 are doped with boron atoms. As described before with respect to FIG. 2, boron atoms are applied to the surfaces of the trenches 807 and heat is applied to the wafer 801 to the desired doping threshold. After the doping process, the trench side walls 803 have a doped layer comprising the doped trench side walls 903. The trench bottom walls 805 were originally doped because the trench bottom walls 805 are made up of the bottom doped silicon layer 105, and, during the doping process, the doped portion of the trench bottom walls 805 may increase in doping concentration, and the boron atoms may diffuse farther into the silicon substrate 103.

Figure 10:
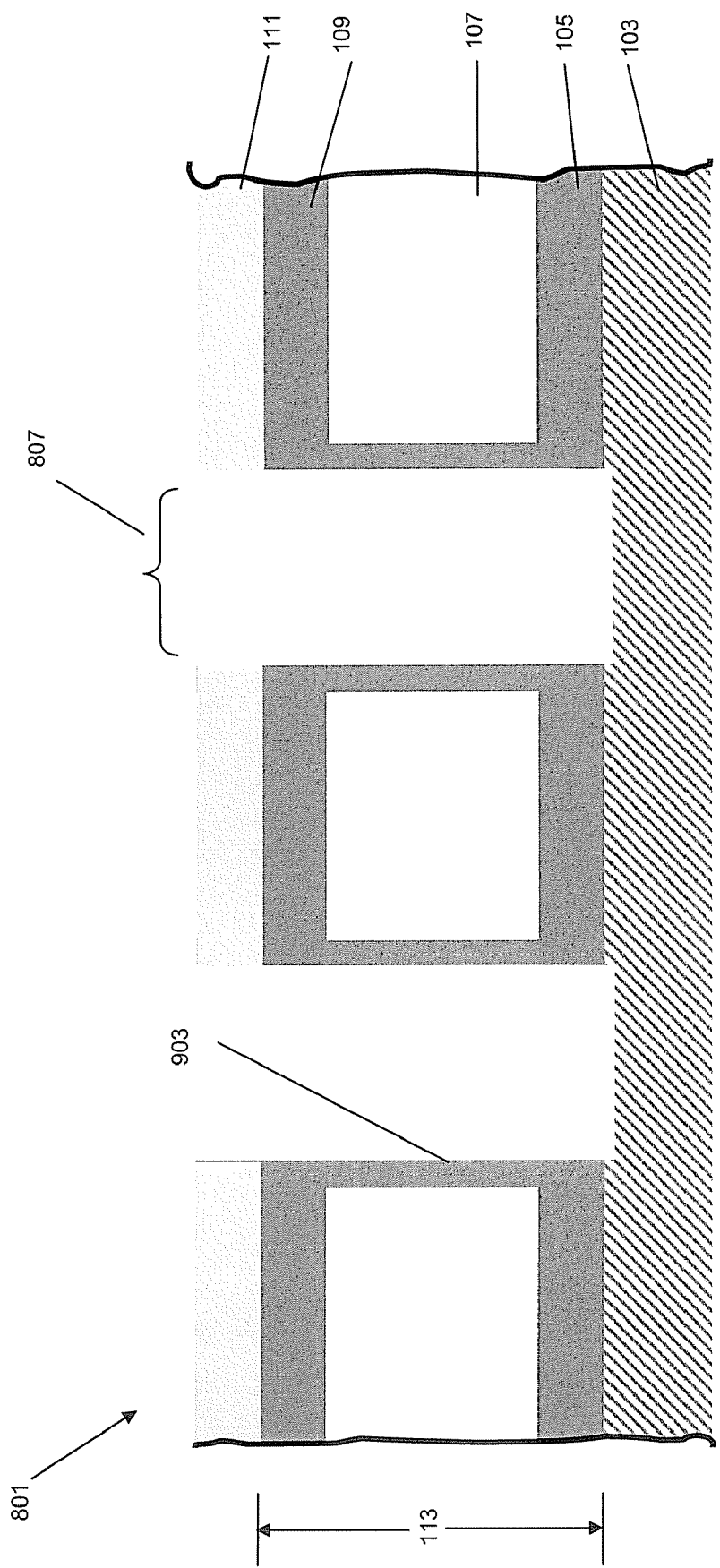
FIG. 10 is a side view of the wafer with the trench bottom wall etched away, according to an example.

FIG. 10 shows the wafer 801 with the trench bottom walls 805 etched away, exposing the silicon substrate 103. Because the oxide layer 111 remains after the doping of the trench side walls 803 and the trench bottom walls 805, the wafer 801 may again be patterned according to the original oxide pattern 117. After the doped trench bottom walls 805 are removed by the deep reactive ion etching process, the silicon substrate 103 is exposed. Because, as discussed with respect to FIG. 8, the trenches 807 are etched so as to terminate within the width of the bottom heavily doped silicon layer 105, removing the doped trench bottom walls 805 creates doped trench side walls 903 that extend to meet the bottom heavily doped silicon layer 105, and do not contain the doped stubs 405 discussed with respect to FIG. 4.

Figure 11:
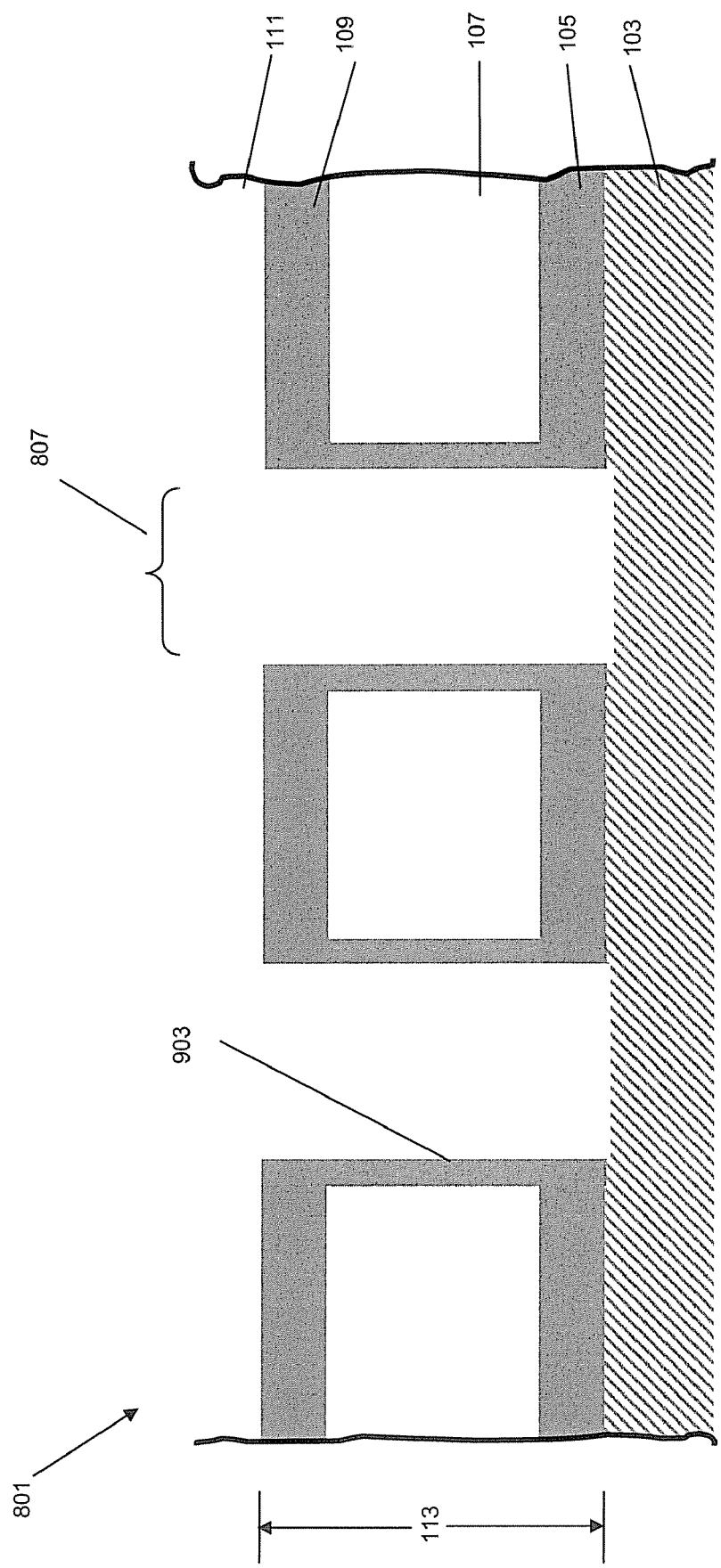
FIG. 11 is a side view of the wafer with the trench bottom wall etched away and the oxide layer removed, according to an example.

As shown in FIG. 11, the remaining portions of the oxide layer 111 are removed by etching away the oxide pattern 117 with a buffered oxide etch.

Figure 12:
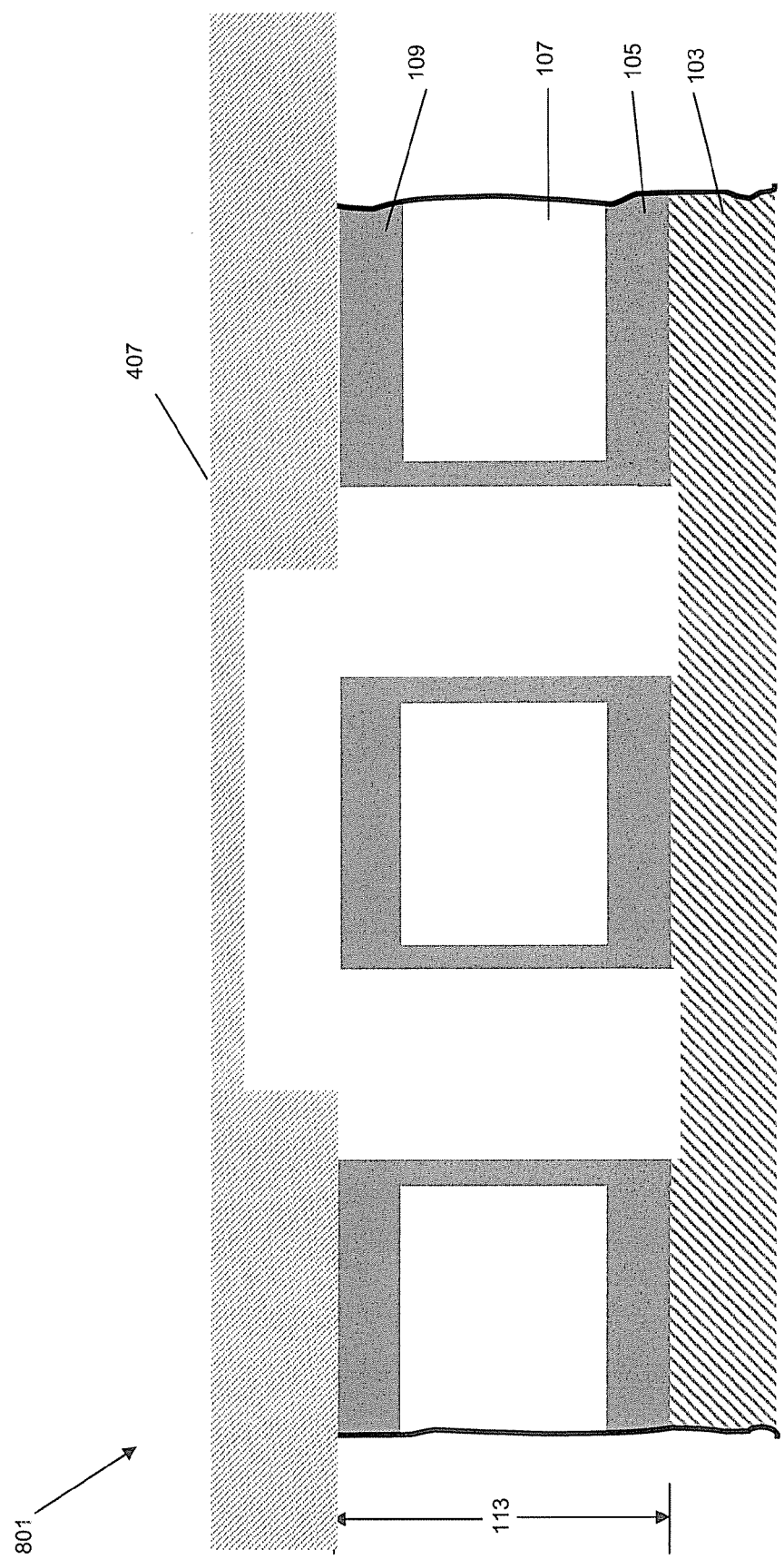
FIG. 12 is a side view of the wafer without doped stubs, with the trench bottom wall etched away, the oxide layer removed, and bonded to a glass wafer, according to an example.

As shown in FIG. 12, a glass wafer 407 is bonded to the wafer 801. The glass wafer 407 may be bonded to the top doped silicon layer 109 by anodic bonding, described with respect to FIG. 6.

Figure 13:
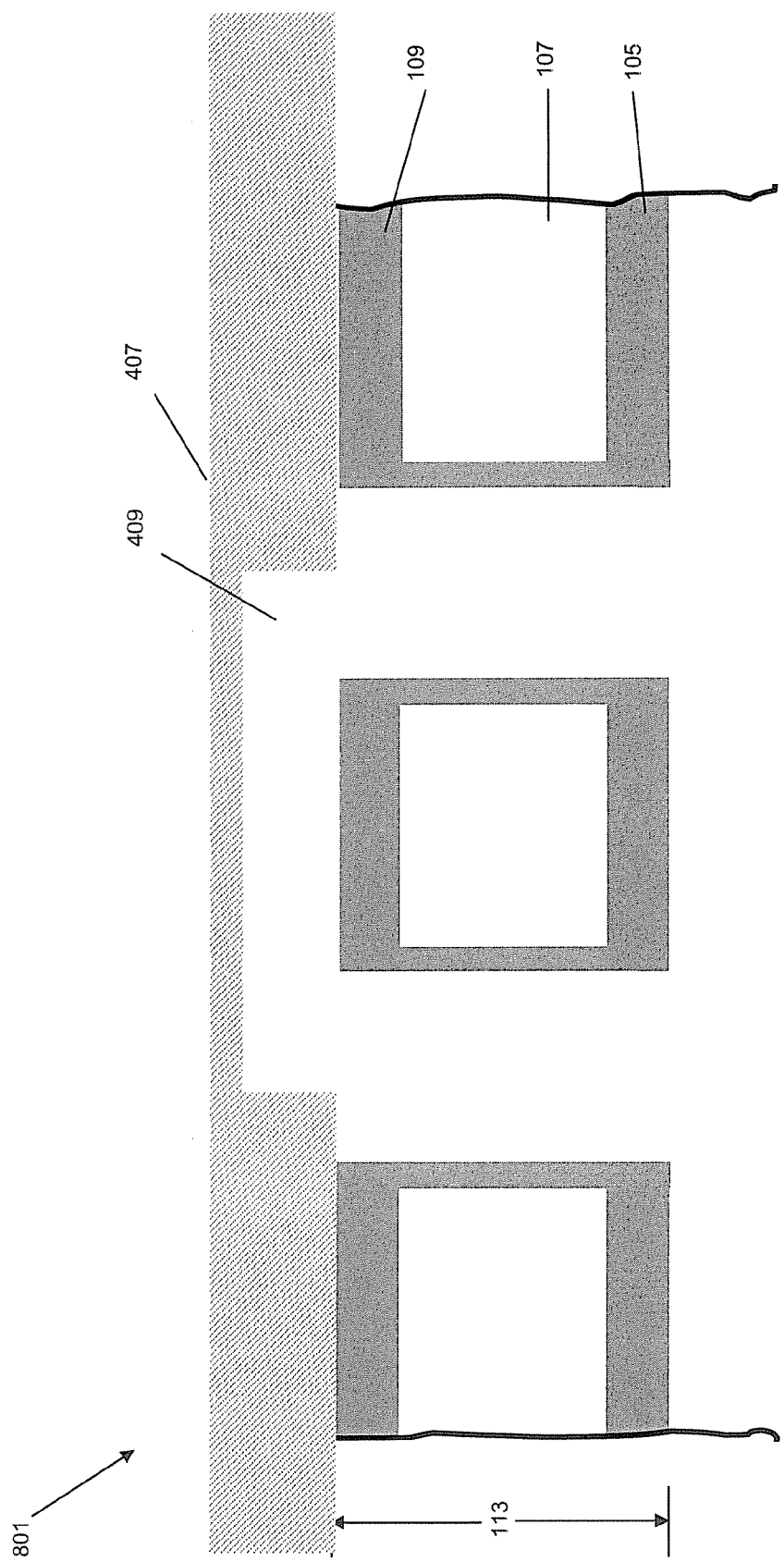
FIG. 13 is a side view of the wafer after removal of the silicon substrate, according to an example.

As shown in FIG. 13, the silicon substrate 103 is removed. The silicon substrate 103 may be removed from the bottom doped silicon layer 105 by an ethylene diamine pyrocatechol treatment ("EDP treatment").

Figure 14:
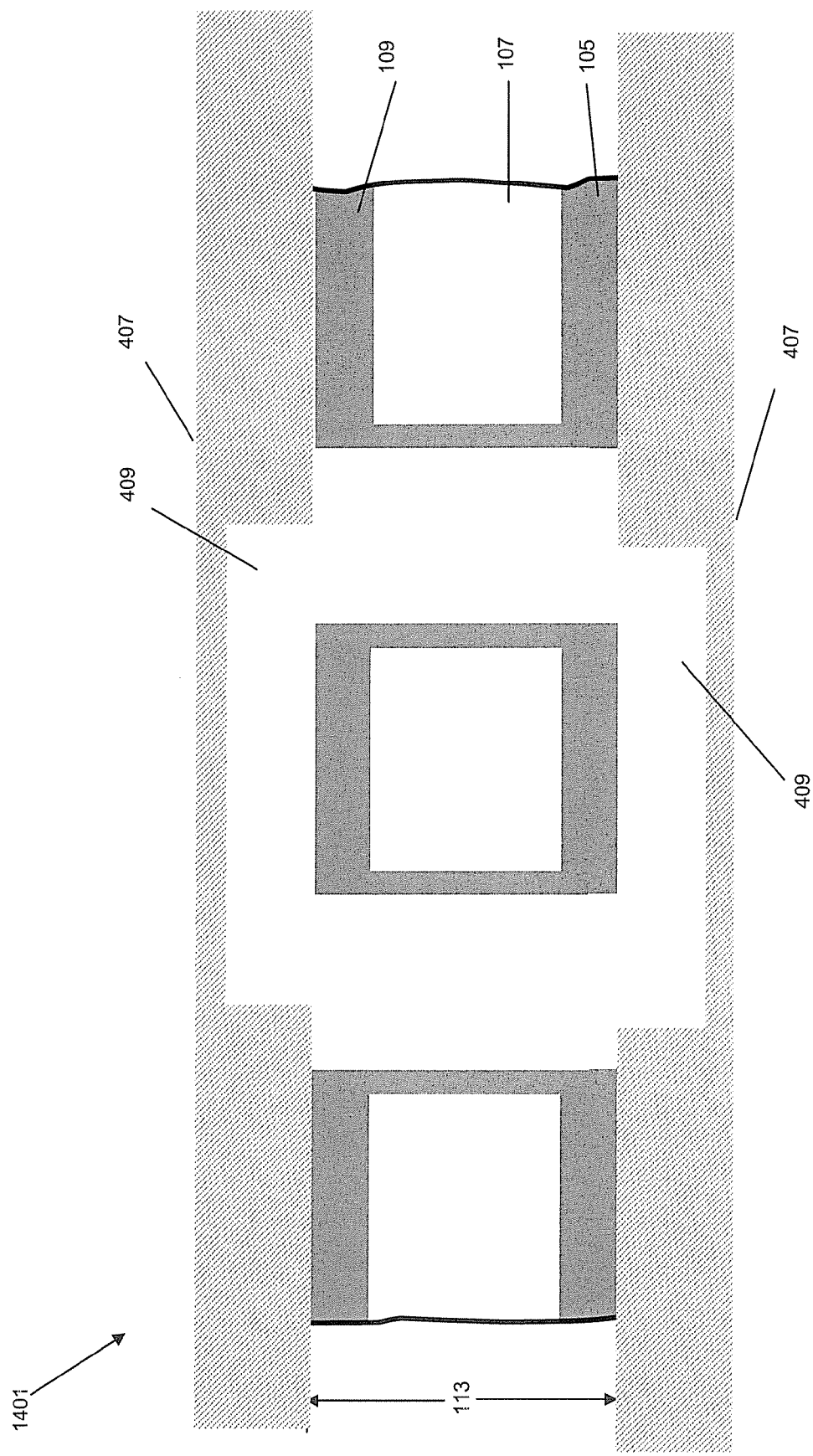
FIG. 14 is a side view of the wafer with a glass wafer bonded to both sides of the wafer, according to an example.

As shown in FIG. 14, a second glass wafer 407 is bonded to the wafer 801. The second glass wafer 407 may be bonded to the wafer 801 as described with respect to FIGS. 6 and 12. This forms the wafer 1401.

Because no doped stubs 405 exist in the wafer 1401, the first and second glass wafers 407 may be bonded to both sides of the wafer 1401. In this way, the movement of the unattached portion of the wafer 801 may be sensed in relation to both the first and second glass wafers 407, resulting in increased accuracy of the MEMS device.

The absence of doped stubs 405 may be advantageous in some applications, because the symmetry of the boron shell silicon structure 1401 may allow two glass wafers 407 to be bonded to two sides of the boron shell silicon structure 1401, thus providing more accurate sensor readings. However, achieving a wafer 801 that does not have doped stubs 405 requires very good control of the etch depth.

Using a bottom doped silicon layer 105 and a top doped silicon layer 109 around an undoped silicon core layer 107 provides increased efficiency in production of MEMS devices that require large epitaxial layers, as this configuration may have less internal stress in the crystal lattice of the silicon. This reduced crystal lattice stress may result in fewer problems with curl and warping, which may render the manufactured wafers unusable. Additionally, a supporting epitaxial layer does not need to be deposited on the backside of the wafer to control the effect of the crystal lattice stress. This greatly reduces the costs and time required for production.

It should be understood that the illustrated embodiments are examples only and should not be taken as limiting the scope of the present invention. For example, other materials and fabricating processes may be used. The claims should not be read as limited to the described order or elements unless stated to that effect. Therefore, all embodiments that come within the scope and spirit of the following claims and equivalents thereto are claimed as the invention.

I claim:

1. A method of producing a wafer for use in a microelectromechanical system, comprising:
   providing a silicon substrate;
   depositing a first boron doped silicon layer on the silicon substrate;
   depositing an undoped silicon core layer on the first boron doped silicon layer; and
   depositing a second boron doped silicon layer on the undoped silicon core layer.

2. The method of claim 1, further comprising depositing an oxide layer on the second boron doped silicon layer, depositing a photoresist layer on the oxide layer in a pattern, and etching the oxide layer not protected by the photoresist layer.

3. The method of claim 2, further comprising using the etched oxide layer to pattern a deep reactive ion etch,
   wherein the deep reactive ion etch creates at least one trench in the wafer, and wherein the at least one trench extends through the first boron doped silicon layer, the undoped silicon core layer, and the second boron doped silicon layer.

4. The method of claim 3, further comprising doping at least one of side walls and a bottom wall of the at least one trench.

5. The method of claim 4, wherein a second deep reactive ion etch etches away the bottom wall of the at least one trench.

6. The method of claim 5, further comprising:
   removing the etched oxide layer from the second boron doped silicon layer, and
   bonding a glass wafer to at least one surface of the remaining second boron doped silicon layer.

7. The method of claim 6, further comprising removing the silicon substrate from the first boron doped silicon layer.

8. The method of claim 2, further comprising using the etched oxide layer to pattern a deep reactive ion etch,
   wherein the deep reactive ion etch creates at least one trench in the wafer, and wherein the at least one trench extends through the undoped silicon core layer and the second boron doped silicon layer, and terminates in the first boron doped silicon layer.

9. The method of claim 8, further comprising doping at least one of side walls and a bottom wall of at the at least one trench.

10. The method of claim 9, wherein a second deep reactive ion etch etches away the bottom wall of the at least one trench.

11. The method of claim 10, further comprising:
    removing the etched oxide layer from the second boron doped silicon layer, and
    bonding a glass wafer to at least one surface of the remaining second boron doped silicon layer.

12. The method of claim 11, further comprising:
    removing the silicon substrate from the first boron doped silicon layer, and
    bonding a glass wafer to at least one surface of the remaining first boron doped silicon layer.

13. A method of producing a wafer for use in a microelectromechanical system, comprising:
    providing a silicon substrate;
    depositing a first doped silicon layer on the silicon substrate;
    depositing an undoped silicon core layer on the first doped silicon layer;
    depositing a second doped silicon layer on the undoped silicon core layer;
    depositing an oxide layer on the second doped silicon layer;
    depositing a photoresist layer on the oxide layer in a pattern;
    etching the oxide layer not protected by the photoresist layer;
    using the etched oxide layer to pattern a deep reactive ion etch, wherein the deep reactive ion etch creates at least one trench in the wafer, and wherein the at least one trench extends through the first doped silicon layer, the undoped silicon core layer, and the second doped silicon layer;
    doping at least one of side walls and a bottom wall of the at least one trench, wherein the bottom wall of the at least one trench is etched with a second deep reactive ion etch;
    removing the etched oxide layer from the second doped silicon layer; and
    bonding a glass wafer to at least one surface of the remaining second doped silicon layer.

14. The method of claim 13, further comprising removing the silicon substrate from the first doped silicon layer.

* * * * *